United States Patent
Nakamura et al.

(10) Patent No.: US 8,636,914 B2
(45) Date of Patent: Jan. 28, 2014

(54) METHOD OF FORMING PATTERN

(75) Inventors: Hiroko Nakamura, Yokohama (JP);
Satoshi Tanaka, Kawasaki (JP); Satoshi Mikoshiba, Yamato (JP); Atsushi Hieno, Kawasaki (JP); Shigeki Hattori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 13/431,209

(22) Filed: Mar. 27, 2012

(65) Prior Publication Data

US 2013/0075360 A1 Mar. 28, 2013

(30) Foreign Application Priority Data

Sep. 26, 2011 (JP) ................... 2011-209918

(51) Int. Cl.
*B29C 33/42* (2006.01)
*B44C 1/22* (2006.01)

(52) U.S. Cl.
USPC .......................................... 216/41; 427/133

(58) Field of Classification Search
None
See application file for complete search history.

(56) References Cited

U.S. PATENT DOCUMENTS

| | | | |
|---|---|---|---|
| 7,521,094 B1 | 4/2009 | Cheng et al. | |
| 2009/0035668 A1* | 2/2009 | Breyta et al. | 430/18 |
| 2011/0039061 A1* | 2/2011 | Fedynyshyn et al. | 428/119 |
| 2011/0147983 A1* | 6/2011 | Cheng et al. | 264/220 |
| 2011/0147984 A1* | 6/2011 | Cheng et al. | 264/220 |
| 2012/0244474 A1* | 9/2012 | Asakawa et al. | 430/296 |
| 2013/0075360 A1* | 3/2013 | Nakamura et al. | 216/41 |
| 2013/0078570 A1* | 3/2013 | Hieno et al. | 430/270.1 |
| 2013/0133825 A1* | 5/2013 | Hattori et al. | 156/272.2 |
| 2013/0183828 A1* | 7/2013 | Nakamura et al. | 438/694 |
| 2013/0209755 A1* | 8/2013 | Hustad et al. | 428/195.1 |

OTHER PUBLICATIONS

Erik W. Edwards, et al., "Dimensions and Shapes of Block Copolymer Domains Assembled on Lithographically Defined Chemically Patterned Substrates", Macromolecules, vol. 40, 2007, pp. 90-96.
Sujin Ham, et al., "Microdomain Orientation of PS-*b*-PMMA by Controlled Interfacial Interactions", Macromolecules, vol. 41, 2008, pp. 6431-6437.
Ricardo Ruiz, et al., "Density Multiplication and Improved Lithography by Directed Block Copolymer Assembly", Science, vol. 321, 2008, pp. 936-939.

* cited by examiner

*Primary Examiner* — Allan Olsen
(74) *Attorney, Agent, or Firm* — Oblon, Spivak, McClelland, Maier & Neustadt, L.L.P.

(57) ABSTRACT

According to one embodiment, there is provided a method of forming a pattern, includes forming a guide pattern including a first region having a first surface energy and a second region having a second surface energy on a to-be-processed film, the first and second regions alternately arranged in one direction, forming a block copolymer layer on the guide pattern, and causing microphase separation in the block copolymer layer, the microphase-separated structure is a lamellar block copolymer pattern.

9 Claims, 12 Drawing Sheets

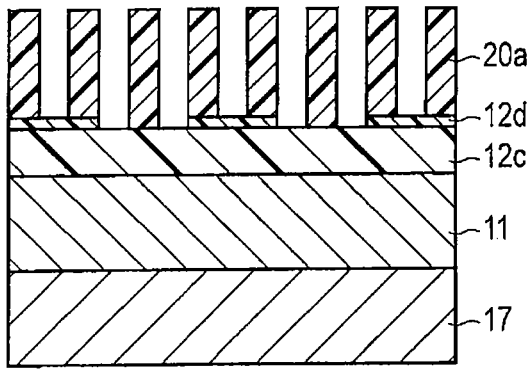
F I G. 9A
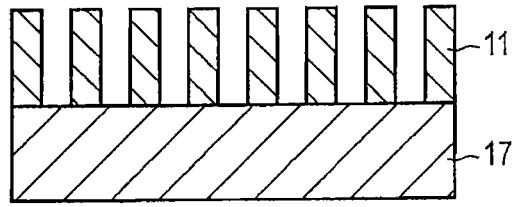
F I G. 9C
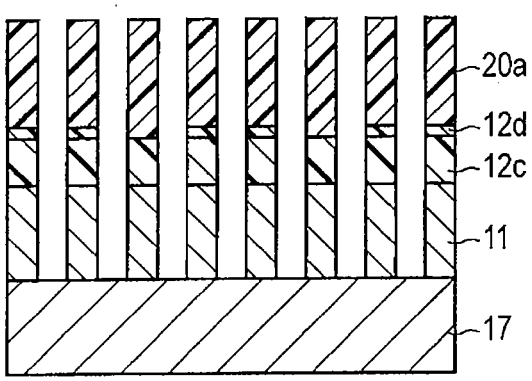
F I G. 9B
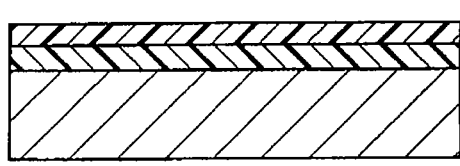
F I G. 11A
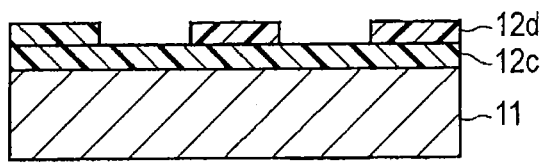
F I G. 11C
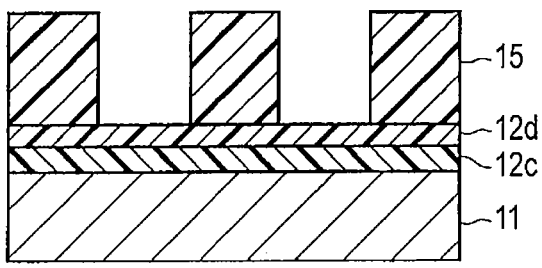
F I G. 11B

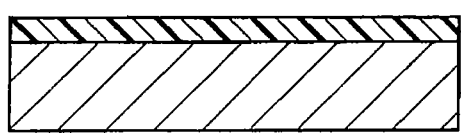
F I G. 12A
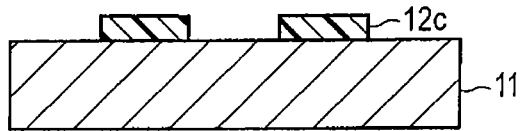
F I G. 12C
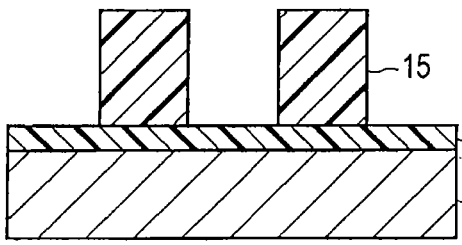
F I G. 12B
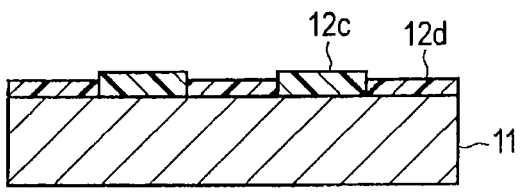
F I G. 12D
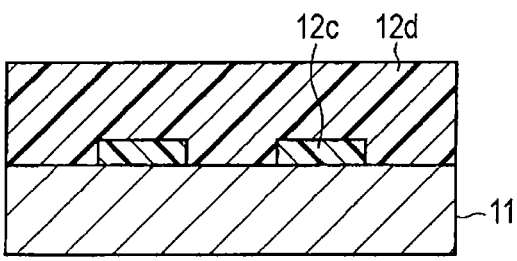
F I G. 13A
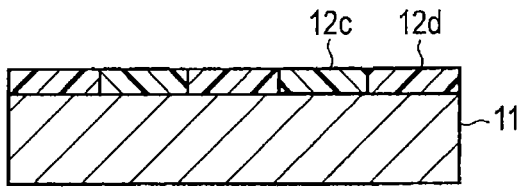
F I G. 13B
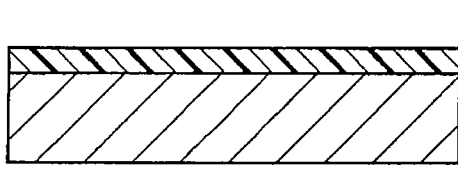
F I G. 14A
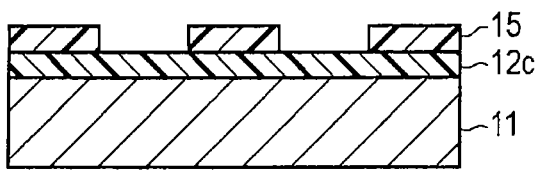
F I G. 14B

METHOD OF FORMING PATTERN

CROSS-REFERENCE TO RELATED APPLICATIONS

This application is based upon and claims the benefit of priority from prior Japanese Patent Application No. 2011-209918, filed Sep. 26, 2011, the entire contents of which are incorporated herein by reference.

FIELD

Embodiments described herein relate generally to a method of forming a pattern.

BACKGROUND

Microprocessing technology by lithography has been adopted for processes of manufacturing various electronic devices such as semiconductor devices including Large Scale Integrations (LSIs). Still finer microprocessing will be required in the future and attempts are being made to make the wavelength of light used in lithography shorter and to achieve higher performance of resist. However, it is becoming difficult to improve the resolution by the above measures.

Further, costs increases as finer patterns are formed. Currently, expensive exposure tools such as an extreme ultraviolet (EUV) exposure tool and an ArF immersion exposure tool are generally used to form fine patterns. The EUV exposure tool used in industrial application generally uses light having a wavelength of 13.5 nm. The ArF immersion exposure tool uses excimer laser emitting light having a wavelength of 193 nm and achieve a large numerical aperture by filling the space between the projection lens and a wafer with water. However, particularly in the EUV exposure tool, the cost of the exposure tool itself and running costs of the exposure tool are high. Thus, the cost of forming a pattern increases greatly. Therefore, a technique which can form fine patterns at low cost is required.

Therefore, microprocessing technology using microphase separation of a block copolymer to process a film attracts much attention. In this technology, it is important to arrange block copolymer in desired orientation on a desired region of the to-be-processed film by microphase separation.

BRIEF DESCRIPTION OF THE DRAWINGS

FIGS. 9A to 9C are cross-sectional views showing the method of forming a pattern according to the example;

FIGS. 11A to 11C are cross-sectional views showing a method of forming a pattern according to Modified example 1;

FIGS. 12A to 12D are cross-sectional views showing a method of forming a pattern according to Modified example 2;

FIGS. 13A and 13B are cross-sectional views showing a method of forming a pattern according to Modified example 3;

FIGS. 14A and 14B are cross-sectional views showing a method of forming a pattern according to Modified example 4;

DETAILED DESCRIPTION

Figure 1:
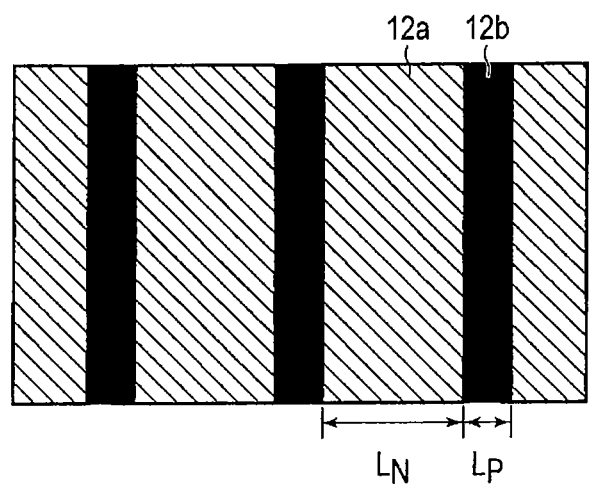
FIG. 1 is a plan view of a guide pattern in a conventional method of forming a pattern.

In general, according to one embodiment, there is provided a method of forming a pattern, comprising: forming a guide pattern including a first region having a first surface energy and a second region having a second surface energy which is different from the first surface energy on a to-be-processed film, the first and second regions alternately arranged in one direction; forming a block copolymer layer on the guide pattern, the block copolymer comprising of a first polymer block and a second polymer block; and causing microphase separation in the block copolymer layer to arrange the first and the second polymer block according to the guide pattern, the microphase-separated structure is a lamellar block copolymer pattern in which the first polymer block and the second polymer block are arranged alternately in the direction of the alternative arrangement of the first and second regions and the interface of the first polymer block and the second polymer block are perpendicular to the surface of the to-be-processed film. The first surface energy is almost the same as a surface energy of the first polymer block and the second surface energy is almost the same as a surface energy of the second polymer block. A pitch of the guide pattern is n times a pitch of the block copolymer pattern, wherein n means an integral number of three or more. Each width of the first and second regions in the direction of arrangement of the first and second regions is m times of a half pitch of the block copolymer pattern, wherein m means odd number of three or more.

Embodiments will be described below with reference to drawings.

The drawings are schematic or conceptual. Therefore, the relationships between the thickness and width of each component, the ratio of sizes among each component, etc., are not necessarily the same as the actual values thereof. Further, the dimensions and ratios may be illustrated differently among the drawings, even for identical portions. In each of the drawings, portions which exhibit the same or similar functions are indicated by the same reference numerals and any overlapping descriptions are avoided.

The block copolymer to be used for Directed Self-Assembly Lithography (DSAL) is comprised of a plurality of polymer blocks in which identical polymer segments are continuously bound and polymer blocks are bound covalently. A fine pattern is formed by microphase-separation of the block copolymer using a repulsive force among the different kinds of polymers comprised of the block copolymer. The morphology of a microphase-separated structure of the block copolymer such as a lamellar phase or cylinder phase is determined by a composition of the block copolymer. For example, in the case of the block copolymer comprised of two kinds of polymer (first polymer and second polymer), the ratio of one polymer is about 50% to form the lamellar morphology. And the ratio of two polymers is about 30% to about 70% to form the cylindrical morphology. In the case of the lamellar morphology, a layer of the first polymer block and a layer of the second polymer block are alternately stacked.

When the microphase separation of the block copolymer is caused without special treatment, a fingerprint-like pattern is formed or lots of domains are formed. Therefore, it is difficult to form a regular pattern like a line and space pattern which is needed in a pattern for a semiconductor. Additionally, it cannot be specified which polymer is positioned at a certain place. Thus, a guide pattern is necessary to arrange block copolymers regularly.

As for a chemical guide, the guide pattern is formed by forming a plurality of regions having different surface energy on a substrate.

Conventional Example

A method of forming a pattern using a conventional chemical guide will be described using FIGS. 1 and 2. In the method of forming a pattern using the conventional chemical guide, a microphase-separated structure of block copolymer is formed based on the guide pattern comprised of the pinning layer and the neutralization layer.

FIG. 1 is a plan view of a conventional chemical guide. The chemical guide herein is comprised of a pinning layer 12b which fixes one polymer constituting the block copolymer (namely, pinning) and a neutralization layer 12a. A width $L_P$ of the pinning layer 12b is set so as to have almost the same width as the half pitch of the block copolymer pattern to be used.

The case where a line and space pattern is formed using the block copolymer comprised of two kinds of polymer will be described. The block copolymer is comprised of a first polymer block and a second polymer block. The surface energy of the first polymer is smaller than that of the second polymer. For example, if the first polymer block is fixed on the pinning layer 12b, the surface energy of the pinning layer 12b is set so as to be equal to or lower than the surface energy of the first polymer. Since a difference in surface energy between the second polymer and the pinning layer 12b is large and the affinity is low, the first polymer block is selectively positioned on the pinning layer 12b. Conversely, when the second polymer block is fixed on the pinning layer 12b, the surface energy of the pinning layer 12b is set so as to be equal to or higher than the surface energy of the second polymer.

The surface energy of the neutralization layer 12a is set so as to take an intermediate value between the surface energy of the first polymer and the surface energy of the second polymer. As a result, interactions between the neutralization layer 12a and the first polymer is nearly equal to that between the neutralization layer 12a and the second polymer. Thus, both the first polymer and the second polymer can be attached to the neutralization layer 12a. As a result, vertically oriented lamellar pattern, in which the first polymer block and the second polymer block are arranged alternately, can be formed as shown in FIG. 2D. In this case, the surface energy of the neutralization layer 12a is higher than that of the first polymer and is lower than that of the second polymer.

When the number of the blocks constituting a block copolymer is 3 or more, the surface energy of the pinning layer 12b is set so that the polymer block having the lowest surface energy or the polymer block having the highest surface energy is fixed on the pinning layer 12b. That is, the surface energy of the pinning layer 12b is set to be equal to or lower than the surface energy of the polymer having the lowest surface energy or set to be equal to or higher than the surface energy of the polymer having the highest surface energy. The surface energy of the neutralization layer 12a is set to be equal to an intermediate surface energy so that each polymer constituting the block copolymer has an affinity with the neutralization layer 12a.

FIG. 2 is a cross-sectional view showing a conventional method to form a pattern. First, the neutralization layer 12a is formed on the to-be-processed film 11 (FIG. 2A).

Figure 2A:
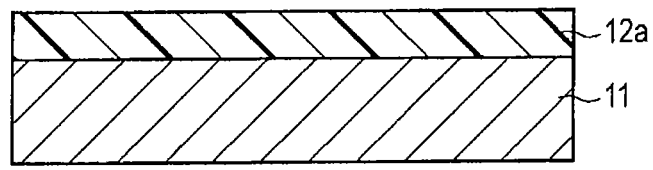
FIGS. 2A to 2D are cross-sectional views showing the conventional method of forming a pattern.
Figure 2B:
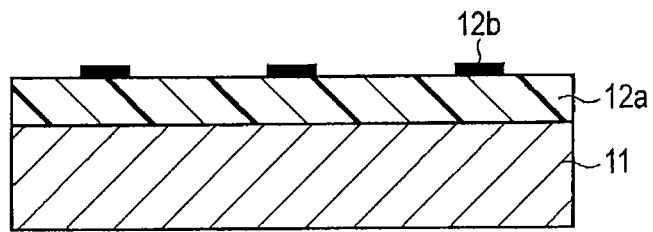

Subsequently, the pinning layers 12b are formed on a part of the surface of the neutralization layer 12a to form a guide pattern in which the neutralization layer 12a and the pinning layer 12b are alternately arranged in one direction (FIG. 2B). The plan view of the guide pattern to be formed in this process is shown in FIG. 1.

When the pitch of the chemical guide pattern is set to be n times of the pitch of the block copolymer pattern (herein, n means an integral number), a lamellar block copolymer pattern having the pitch of 1/n can be formed. This is called "frequency doubling" or "density multiplication". The use of the block copolymer enables to form a fine pitch pattern which cannot be formed by a conventional lithography method using only exposure tools.

For example, when the pitch of the chemical guide pattern is twice larger than the pitch of the block copolymer pattern, the width of the neutralization layer 12a ($L_N$ in FIG. 1) is about three times larger than the half pitch (hereinafter, referred to as a half pitch) of the block copolymer pattern. When the pitch of the chemical guide pattern is three times larger than the pitch of the block copolymer pattern, the width of the neutralization layer 12a ($L_N$) becomes about five times larger than the half pitch of the block copolymer pattern. When the pitch of the chemical guide pattern is four times larger than the pitch of the block copolymer pattern, the width of the neutralization layer 12a ($L_N$) becomes about seven times larger than the half pitch of the block copolymer pattern. On the other hand, a width of the pinning layer 12b (Lp) is almost the same as the half pitch of the block copolymer pattern.

Figure 2C:
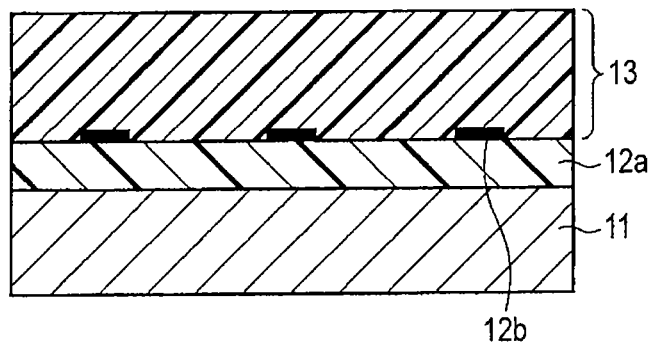
Figure 2D:
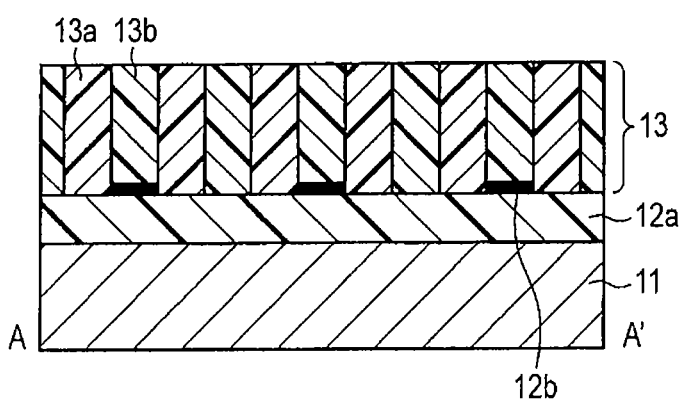

A block copolymer layer 13 is formed on the formed guide pattern (FIG. 2C).

After the formation of the block copolymer layer 13, microphase separation is caused in the block copolymer layer 13 by heating the block copolymer layer in vacuum or under an atmosphere of nitrogen, or exposing it to a solvent atmosphere. As a result, a microphase-separated pattern of the block copolymer, in which the first polymer block and the second polymer block constituting the block copolymer are oriented according to the guide pattern as shown in FIG. 2D, is formed. The microphase-separated structure is a lamellar morphology in which the first polymer block 13a and the second polymer block 13b are arranged alternately in the direction of alternate arrangement of the pinning layer and the neutralization layer, and the interface of the first polymer block and the second polymer block are perpendicular to the surface of the to-be-processed film 11. The second polymer block 13b is fixed on the pinning layer 12b.

Thereafter, one of the blocks out of the first block polymer 13a and the second polymer block 13b is selectively removed from the block copolymer layer 13 and a line and space pattern can be formed. The pattern made of the remained polymer block can be used as a mask pattern to etch the to-be-processed film 11.

The width of the pinning layer 12b (Lp) is usually set so as to have almost the same as the half pitch of the block copolymer. Accordingly, the width of the pinning layer 12b (Lp) becomes narrow as the pattern size of devices shrinks and it becomes difficult to form the pinning layer 12b with high accuracy.

In the case of density multiplication, the chemical guide pattern is required to be a pattern with a line/space ratio of 1:3 and 1:5 which is shifted from 1:1. In this case, it is difficult to form the line pattern with high accuracy because the line width becomes very narrow. Problems such as an increase in line edge roughness and cut-off of the lines happens during resist patterning for chemical guide pattern and during etching.

When the guide pattern is formed, particularly by irradiating with energy rays (i.e. exposure), if the width ratio of the line and space is shifted from 1:1, a process margin of exposure is reduced and a resolution limit is reduced even in the case the guide patterns have same pitch as each other.

The results obtained by estimating relationships between the line width and the process margin of exposure on the assumption that the pitch of the guide pattern is constant will be described with reference to FIG. 3. The process margin of exposure is calculated based on optical image simulation.

The exposure conditions were as follows: NA: 1.35, dipole illumination; illumination opening shape: circular; center of opening: 0.85, σ: 0.1. A reticle has a line and space pattern and the line width is 42 nm and the space width is 42 nm. "1:1 line and space" means the case where the line width is 42 nm and the space width is 42 nm. The term "1:5 line and space" means the case where the line width is 14 nm and the space width is 70 nm and 1:5 line and space pattern is formed when the pitch of the guide pattern is three times larger than the pitch of the block copolymer pattern.

Figure 3A:
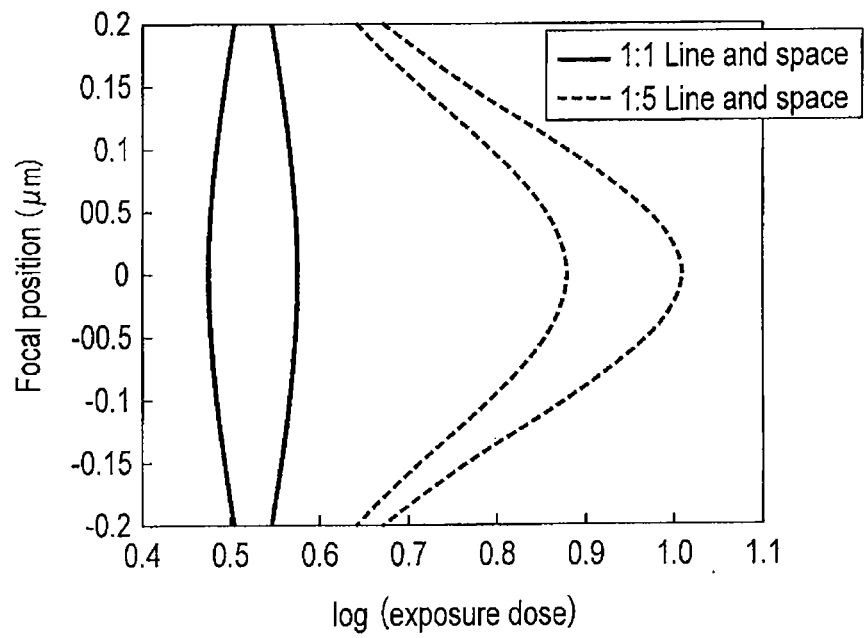
FIGS. 3A and 3B are views showing process windows of exposure in the guide pattern formation when the line width is changed in the condition that the pattern pitch is constant.

In FIG. 3A, a range where change of the line width is within 4.2 nm when a depth of focus and an exposure dose are changed is surrounded by lines. This is called "Exposure-Defocus tree". A region surrounded by two lines satisfies this condition. Solid lines show the case of a 1:1 line and space pattern and dotted lines show the case of a 1:5 line and space pattern.

In the case of the 1:1 line and space pattern, the region surrounded by two lines is symmetric. Therefore, when changing the exposure dose, a focal range in which change of the line width is within 4.2 nm can be widely extended and the range of the depth of focus is not extremely narrowed. On the other hand, in the case of the 1:5 line and space pattern, the region surrounded by two lines is curved. Therefore, if the exposure dose is changed, the focal range in which change of the line width is within 4.2 nm becomes narrower as compared with the case of the 1:1 line and space pattern. That is, in the case of the 1:5 line and space pattern, the range of the depth of focus becomes narrower as compared with the case of the 1:1 line and space pattern.

Figure 3B:
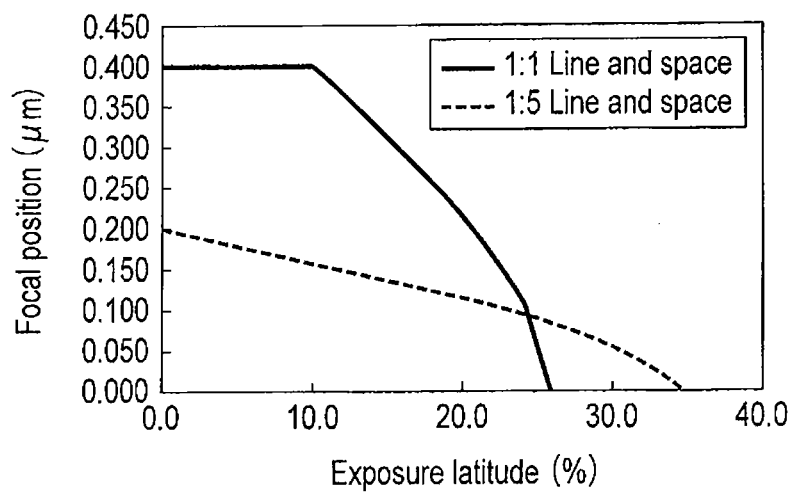

FIG. 3B is a view showing a relationship between the depth of focus and exposure latitude. The exposure latitude means a change by % of exposure dose from an exposure dose capable of providing a pattern with a desired size. The changed exposure dose (%) is defined as a exposure latitude. The solid lines show the case of the 1:1 line and space pattern and dotted lines show the case of the 1:5 line and space pattern. It is found that, in the case of the 1:1 line and space pattern, a range of depth of focus is wider if the exposure dose is changed, as compared with the case of the 1:5 line and space pattern. In the case of the 1:1 line and space pattern, the depth of focus is saturated at 0.4 μm because the focus range to be calculated is ±0.2 μm. Therefore, if the focus range to be calculated is extended, the depth of focus in the saturated region becomes more than 0.4 μm. (Theoretically, the depth of focus is infinite.)

In the actual patterning, the process margin of exposure becomes less than the theoretical value due to the process factors. Consequently, it is considered that it is difficult to form the 1:5 line and space pattern near the resolution limit. In fact, when forming the resist pattern, the 1:1 line and space pattern having a line width of 42 nm and a space width of 42 nm can be formed. However, the 1:5 line and space pattern having a line width of 14 nm and a space width of 70 nm cannot be formed.

Thus, if the guide pattern is shifted from 1:1, the process margin of exposure is narrowed when forming the guide pattern. In order to form the block copolymer pattern at low cost, it is preferable that the guide pattern is formed near the resolution limit by maximizing the performance of the exposure tools. Thus, the margin in forming the guide pattern is narrowed, which leads to the narrowing of the resolution limit of the guide pattern. As a result, there has been a problem that a fine pattern cannot be formed.

Therefore, it was examined that the line width ($L_p$) of the pinning layer 12b is extended. However, It was thought that there was an optimal value of the line width $L_p$. If the size was shifted from the optimal value, it became difficult to arrange the block copolymer. Thus, there was a limit to extend the width $L_p$ of the pinning layer. There was an example in which the resist line width (namely, the width of the pinning layer 12b) is changed in a range from 0.26 to 0.65 of the pitch of the block copolymer pattern in the condition that the pitch of the guide pattern is constant and the pitch of the guide pattern is equal to the pitch of the block copolymer pattern. If the width of the pinning layer 12b is shifted from the optimal value, it becomes difficult to arrange the block copolymer and defects are observed. Since the defects are thus caused, there is a limit to extend the width $L_p$.

Thus, in the conventional pattern formation process using the pinning layer, it is necessary to form a very fine pinning layer having half of the pitch of the block copolymer pattern and thus it has various problems.

(Method of Forming a Pattern According to an Embodiment)

Hereinafter, the method of forming a pattern according to the embodiment will be described.

Figure 4:
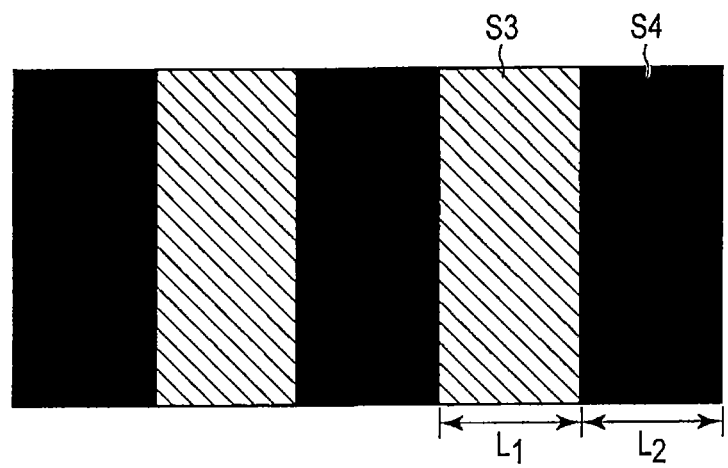
FIG. 4 is a plan view showing a guide pattern in a method of forming a pattern according to an embodiment.

First, a method of forming a pattern using a chemical guide will be described using FIGS. 4 and 5. FIG. 4 is a plan view showing a guide pattern in a method of forming a pattern according to the embodiment.

In the chemical guide shown in FIG. 4, a region having first surface energy S3 and a region having second surface energy S4 are alternately arranged in one direction. The surface energy of the first region is different from that of the second region.

The guide pattern of the embodiments is different in the following points from the conventional example.

In this embodiment, the surface energy of the first region S3 and the second region S4 in the guide pattern is set so as to be almost the same as the surface energy of the two kinds of polymer constituting the block copolymer. That is, the first region S3 has almost the same surface energy as that of a first polymer block 13a constituting a block copolymer to be stacked on the guide pattern. The second region S4 has almost the same surface energy as that of a second polymer block 13b constituting a block copolymer to be stacked on the guide pattern.

Each width of the first region S3 ($L_1$ in FIG. 4) and the second region S4 ($L_2$ in FIG. 4) in the direction of arrangement of the first and second regions S3, S4 is nearly equal or equal to m times of the half pitch of the block copolymer (wherein m means odd number of three or more). Therefore, the widths $L_1$ and $L_2$ are represented by the following equations.

$$L_1 \approx (2r+1) \times (\text{pitch of block copolymer pattern}/2)$$

$$L_2 \approx (2s+1) \times (\text{pitch of block copolymer pattern}/2)$$

In the equation, r and s represent an integer of 1 or more.

The pitch of the guide pattern ($L_1+L_2$) is nearly equal or equal to n times the pitch of the block copolymer pattern (wherein n means an integral number of three or more).

Therefore, the pitch of the guide pattern ($L_1+L_2$) can be represented by the following equation.

$$L_1+L_2 \approx n \times \text{pitch of block copolymer pattern}$$

If the width of the first region S3 ($L_1$) is nearly equal to the width of the second region S4 ($L_2$), the process margin of exposure to form the guide pattern theoretically becomes infinite as explained using FIG. 3. Thus, when the width $L_1$ and the width $L_2$ are nearly equal, an exposure margin can be widened to the maximum. Accordingly, it is desirable that $L_1$ is almost the same as $L_2$.

When the ratio of the width $L_1$ and the width $L_2$ is shifted from 1:1, the exposure margin becomes narrower. For example, in the case where the width $L_1$ is three times larger than the half pitch of block copolymer pattern and the width $L_2$ is five times larger than the half pitch of block copolymer pattern, the exposure margin is worse than that in the case where the width $L_1$: the width $L_2$ is 1:1 in the same guide pattern pitch. However, the exposure margin is better than the conventional case in which the width of the pinning layer is almost the same as the half pitch of block copolymer pattern and the width of the neutralization layer is three times larger than the half pitch of block copolymer pattern.

Here, the case where the width $L_2$ is nearly equal to the width $L_1$ and they are three times larger than the half pitch of the block copolymer pattern will be described as an example.

FIG. 5 is a cross-sectional view showing the method of forming a pattern according to the embodiment.

Figure 5A:
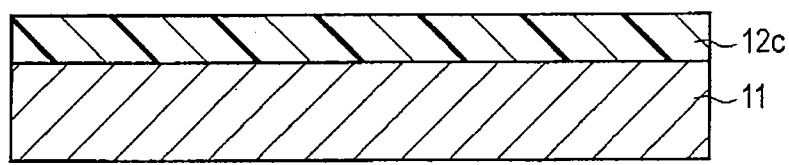
FIGS. 5A to 5D are cross-sectional views showing a method of forming a pattern according to the embodiment.
Figure 5B:
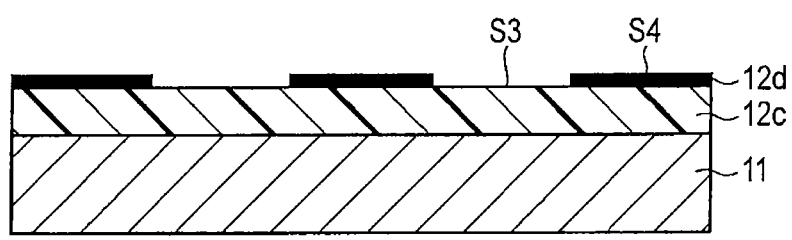

First, a guide pattern composed of the region having first surface energy S3 and the region having second surface energy S4 is formed on the to-be-processed film 11. FIG. 5 shows the guide pattern formed by forming a layer having the first surface energy 12c on the to-be-processed film 11 (FIG. 5A) and selectively forming a layer having the second surface energy 12d on the layer having the first surface energy 12c (FIG. 5B).

For example, the guide pattern can be formed using following method comprising: forming a layer having a first surface energy 12c on the to-be-processed film 11; applying a photoresist on the layer having first surface energy 12c to form a photoresist layer; irradiating a portion of the photoresist layer selectively with energy rays; developing the photoresist layer to form a photoresist pattern; using the photoresist pattern as an etching mask or a mold to form the first and the second region; and thereafter, removing the photoresist layer.

Another method of forming the guide pattern is following method, for example. In this method, the layer comprising a photosensitive material is formed on the to-be-processed film 11. In order to cause a difference in surface free energy between the first and second regions, the part of the photosensitive material which becomes either of the first and second regions is irradiated with energy rays or irradiating the first and second regions with energy rays under different conditions.

The method of forming a guide pattern is not limited thereto, and various methods to be described later can be used.

Figure 5C:
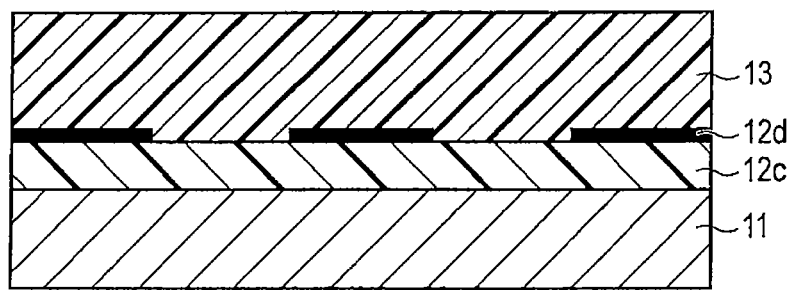
Figure 5D:
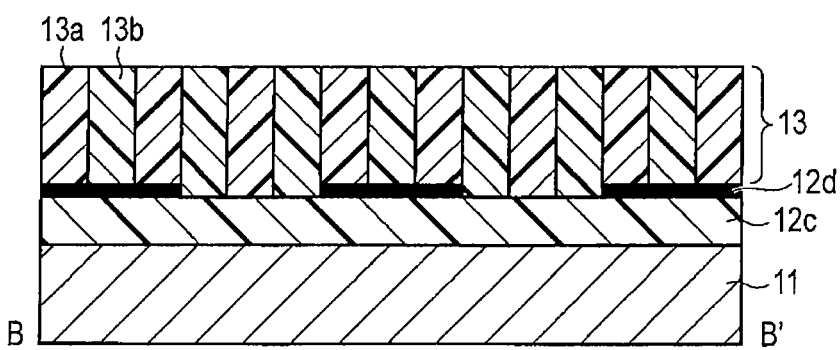

Subsequently, the block copolymer layer 13 is formed on the guide pattern (FIG. 5C). The block copolymer includes first and second polymer blocks which have different characteristics. After the formation of the block copolymer layer 13, a microphase separation is caused in the block copolymer layer 13 by heat anneal. As a result, a microphase-separated structure of the block copolymer, in which the first polymer block and the second polymer block are oriented according to the guide pattern is formed. As shown in FIG. 5D, the microphase-separated structure is a lamellar morphology in which the first and second polymer blocks 13a, 13b are arranged alternately in the direction of alternate arrangement of the region having the first surface energy S3 and the region having the second surface energy S4 and the interface of the first polymer block and the second polymer block is perpendicular to the surface of the to-be-processed film. The pitch of the block copolymer pattern is one-third of the pitch of the guide pattern.

When FIG. 5B is compared to FIG. 5D, it is found that a pattern finer than the guide pattern can be formed by using the block copolymer. The block copolymer pattern having a pitch of one-nth of the pitch of the guide pattern can be formed by setting the pitch of the guide pattern to n times (n is an integral number of three or more) the pitch of the block copolymer pattern. Therefore, it is possible to form a pattern having a pitch, which cannot be formed with the conventional method using the exposure tools only, by utilizing the microphase separation of the block copolymer.

If the method of this embodiment is used, it is not necessary to form the resist pattern having the line width extremely narrower than the half pitch of the guide pattern in the guide pattern formation. As shown in FIG. 4, the guide pattern with a line width/space width ratio of close to 1:1 may be formed. If such a guide pattern is used, particularly, when irradiating energy-rays utilizing two-beam interference (dipole illumination is one of the examples of the two-beam interference), a process margin of exposure becomes wider and even a pattern having a smaller pitch can be resolved. Thus, the guide pattern can be formed using a relatively inexpensive exposure tools. As a result, a fine block copolymer pattern having a pitch of 1/integer of the pitch of the guide pattern (wherein the integer is an odd number of three or more) can be formed with high accuracy.

Here, a mechanism by which the block copolymer is arranged will be described. The mechanism of the arrangement of the block copolymer in the conventional example will be described with reference to FIG. 6. Then, the mechanism of the arrangement of the block copolymer in the embodiments will be described with reference to FIG. 7.

FIG. 6 is a plan view showing the arrangement of block copolymer molecules in the conventional method of forming a pattern described above. The block copolymer is not necessarily arranged along the guide pattern immediately after coating. Block copolymer molecules can move by heat anneal by solvent anneal so that the total free energy is minimized. A regular pattern is obtained as a result of the block copolymer arrangement so as to make an interaction energy between the guide pattern and the block copolymer small.

Figure 6A:
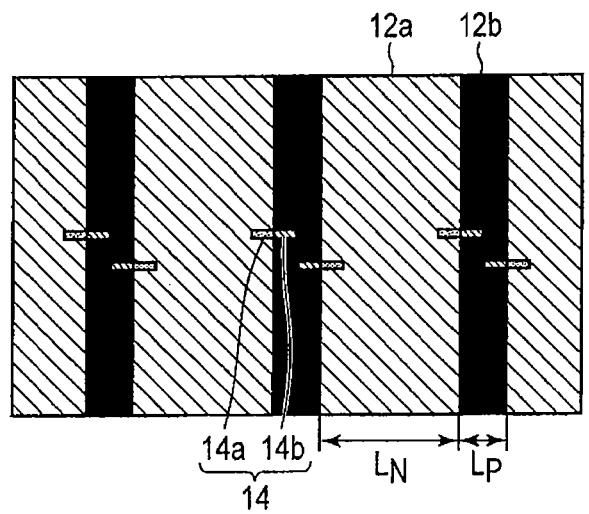
FIGS. 6A to 6C are plan views showing an arrangement of block copolymers in the conventional method of forming a pattern.

A block copolymer molecule 14 is comprised of the first polymer block 14a and the second polymer block 14b. In the conventional example, as shown in FIG. 6A, the second polymer block 14b has an affinity with the pinning layer 12b. If the second polymer block 14b moves on the surface of the pinning layer 12b, and the first polymer block 14a having a lower affinity with the pinning layer 12b than that as compared with the second polymer block 14b has, moves on the surface of the neutralization layer 12a, the total free energy is reduced. That is, as shown in FIG. 6A, the block copolymer is arranged according to the surface energy change at the edge of the guide pattern.

Figure 6B:
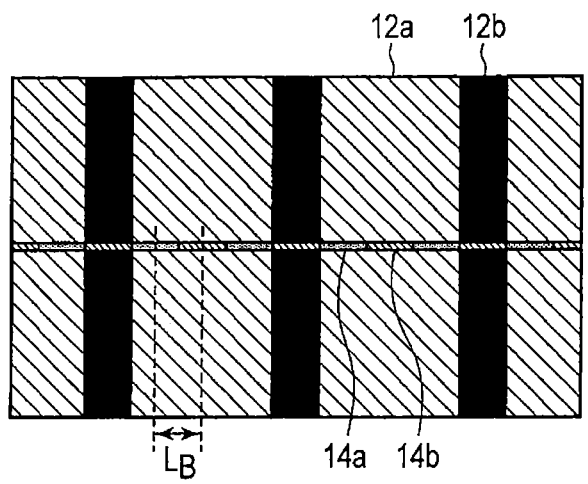

The block copolymer molecules are regularly arranged so as to be perpendicular to the edge of the guide pattern starting from the block copolymer molecules 14 fixed at the edge of the guide pattern as described above (FIG. 6B). In FIG. 6B, a width $L_B$ corresponds to the length of a molecule of block copolymer. The first polymer block 14a has the different surface energy from that the neutralization layer 12a has and the second polymer block 14b has the different surface energy from that the neutralization layer 12a has. However, it is considered that both the first polymer block 14a and the second polymer block 14b are arranged on the neutralization layer 14a because the neutralization layer 12a has a surface energy between two polymer blocks.

Figure 6C:
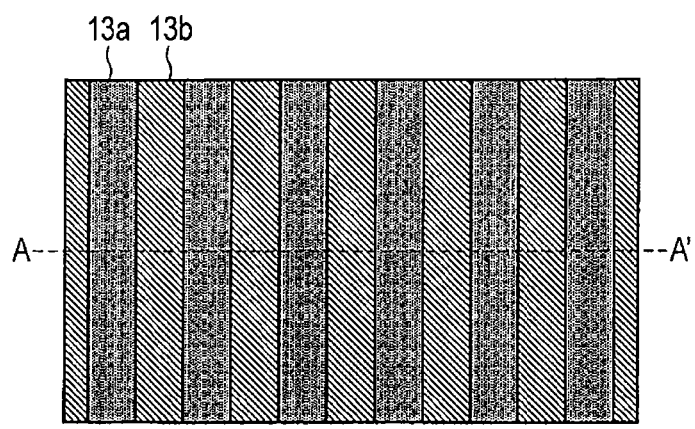

When the block copolymer molecules are regularly arranged so as to be perpendicular to the edge of the guide pattern, the first polymer block 13a and the second polymer block 13b are alternately arranged all over the block copolymer film as shown in FIG. 6C. As a result, a block copolymer pattern having the half pitch of the guide pattern is obtained. FIG. 2D is a cross-sectional view showing FIG. 6C cut at a line A-A'. As shown in FIG. 2D, a lamellar block copolymer pattern in which the first polymer block and the second polymer block are arranged alternately in one direction and the interface between the first and second polymer blocks 13a, 13b is perpendicular to the surface of the to-be-processed film is obtained.

As described above, if the width of the pinning layer 12b is greatly shifted from the optimal value, the arrangement of the block copolymers gets out of order. When the width of the pinning layer 12b greatly shifts from the optimal value (namely, about half of the pitch of the block copolymer), if the block copolymer molecules are forced to be regularly arranged, the block copolymer molecules need to stretch to fill a gap formed between adjacent block copolymer molecules. Conversely, when the space for the block copolymer molecules are narrow, the block copolymer molecules need to shrink. The arrangement of the block copolymers is unstable because the free energy increases by the stretch and the shrink of the block copolymer molecules.

Subsequently, the case of the embodiment will be described using FIG. 7.

Figure 7A:
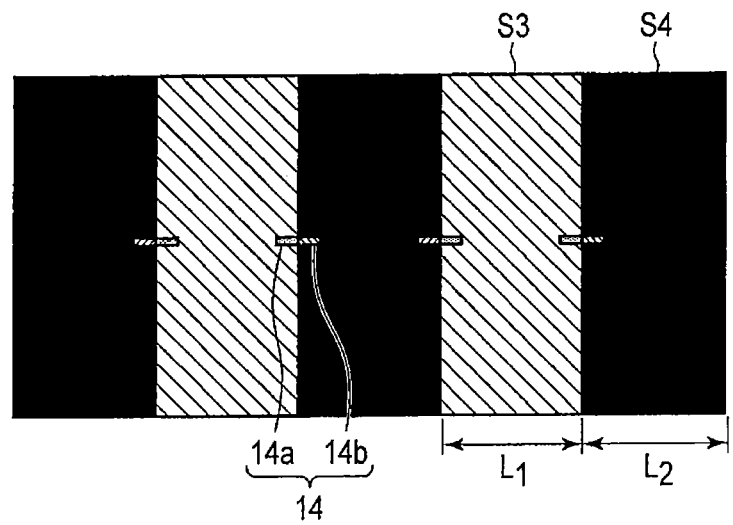
FIGS. 7A to 7C are plan views showing an arrangement of the block copolymer in a method of forming a pattern according to an embodiment.

In the case of the embodiment, the heat anneal or solvent anneal makes the block copolymer molecules to move so that the total free energy is minimized. The first polymer block 14a has almost the same surface energy as that of the region having the first surface energy S3, and the second polymer block chain 14b has almost the same surface energy as that of the region having the second surface energy S4. Thus, the first polymer block 14a has a high affinity with the region having the first surface energy S3, and the second polymer block 14b has a high affinity with the region having the second surface energy S4. As a result, the block copolymer molecules 14 are arranged at an interface of the region having the first surface energy S3 and the region having the second surface energy S4. That is, the block copolymer is arranged according to the surface energy change at a boundary between region having the first surface energy S3 and the region having the second surface energy S4 (FIG. 7A).

Figure 7B:
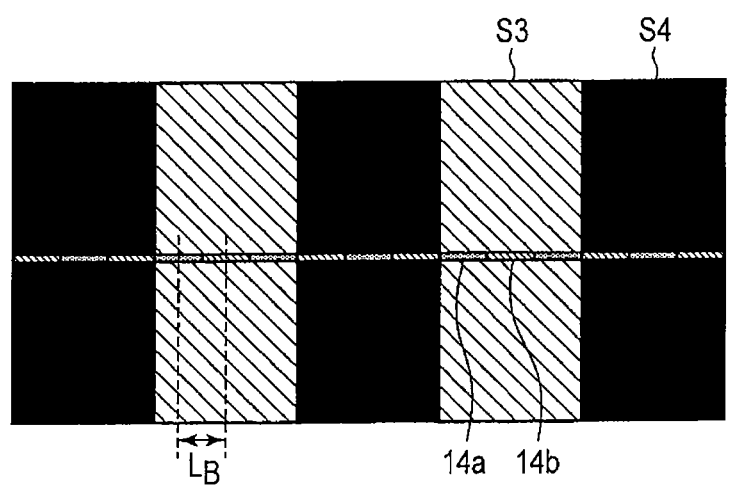

Thus, the block copolymer molecules are regularly arranged so as to be perpendicular to the edge of the guide pattern starting from the block copolymer molecule 14 fixed at the edge of the guide pattern (FIG. 7B). The width $L_B$ in FIG. 7B corresponds to the length of a molecule of block copolymer. Because there is a difference in surface energy between the region having the first surface energy S3 and the second polymer block 14b. Thus, the free energy increases at a part where the second polymer block 14b is located on the region having the first surface energy S3 in comparison with the at a part where the surface energy of the region is the same as that of the polymer block. However, if the difference in surface energy is within a constant range, both the first polymer block 14a and the second polymer block 14b can be arranged on the region having the first surface energy S3 and a vertically-oriented lamellar pattern can be formed on the region having the first surface energy S3. The same holds true for the region having the second surface energy S4.

Figure 7C:
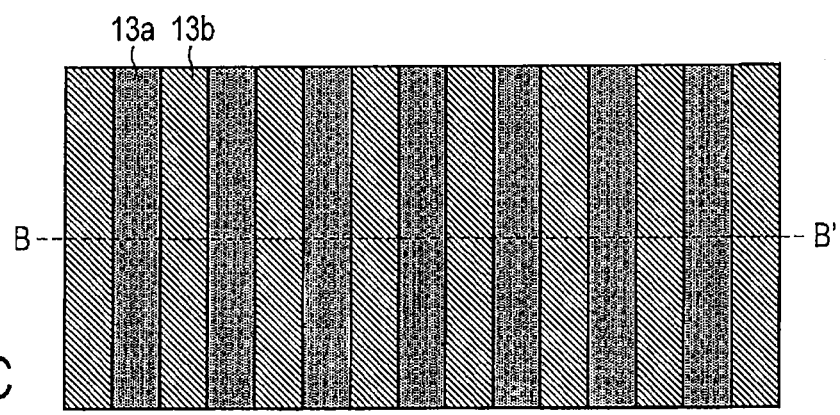

When the block copolymer molecules 14 are regularly arranged so as to be perpendicular to the edge of the guide pattern, the first polymer block 13a and the second polymer block 13b are alternately arranged all over the block copolymer film as shown in FIG. 7C. As a result, a block copolymer pattern having the half pitch of the guide pattern is obtained as shown in FIG. 7C. FIG. 5D is a cross-sectional view showing FIG. 7C cut at a line B-B'. A lamellar pattern in which the first polymer block and the second polymer block are arranged alternately in one direction and the interface between the first and second polymer blocks 13a, 13b is perpendicularly to the surface of the to-be-processed film 11 is obtained.

Similarly to the conventional example, if the width of the region having the first surface energy S3 ($L_1$) and the width of the region having the second surface energy S4 ($L_2$) are greatly shifted from an odd multiple of the half pitch of the block copolymer pattern, the arrangement of the block copolymer gets out of order. In this case, if the block copolymer molecules are forced to be regularly arranged, the block copolymer molecules need to stretch to fill a gap between adjacent block copolymer molecules or the block copolymer molecules need to shrink when the space for the block copolymer molecules is narrow. Because the free energy increases by the stretch and the shrink of the block copolymer molecules, the arrangement of the block copolymers is unstable.

If the free energy increased by the stretch and the shrink of the block copolymer molecules are within a constant range, it is possible to arrange the block copolymers along the guide pattern. That is, if the size shift of the guide pattern is small, the block copolymers can be arranged. Therefore, the width of the region having the first surface energy S3 ($L_1$) and the width of the region having the second surface energy S4 ($L_2$) may not be completely, but nearly equal to m times of the half pitch of the block copolymer pattern (wherein m means odd number of three or more). The width of the region having the first surface energy S3 ($L_1$) and the width of the region having the second surface energy S4 ($L_2$) are permitted to be about ±20% of three times the half pitch of the block copolymer pattern.

The evaluation of the conventional method was performed by changing the width of the guide pattern in the condition that the period of the guide pattern pitch is the same as that of the block copolymer pattern. However, the stretch and the shrink change in width was limited to a range from one-fourth to three-fourths the pitch of the block copolymer pattern. Therefore, it was considered that it was suitable to form a pinning layer having a width of about half of the pitch of the block copolymer pattern in order to prevent the stretch and the shrink of the block copolymer molecules. If the width was greatly shifted from half of the pitch of the block copolymer pattern, the arrangement of the block copolymers was out of order. However, like this embodiment, it is possible to regularly arrange the block copolymer by designing width of the guide pattern so as to be equal to m times of the half pitch of the block copolymer (wherein m means odd number of three or more) in order to prevent the stretch and the shrink of the block copolymer molecules.

Subsequently, as an example, a specific method of forming a pattern will be described.

Example

FIG. 8 is a cross-sectional view showing the method of forming a pattern according to the example. The block copolymer used herein is a block copolymer including a polystyrene block and a polymethacrylate block.

Figure 8A:
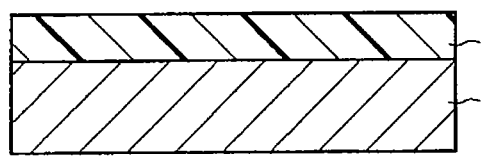
FIGS. 8A to 8F are cross-sectional views showing a method of forming a pattern according to an example.

First, the layer having the first surface energy 12c (i.e., an organic coating film having almost the same surface energy as that of polymethylmethacrylate) was formed on the to-be-processed film 11 comprised of a silicon oxide (FIG. 8A). The layer having the first surface energy 12c is configured also to be an antireflective coating for ArF exposure. When only the layer having the first energy 12c does not serve as the antireflective coating, another layer may be further formed below the layer having the first surface energy.

Figure 8D:
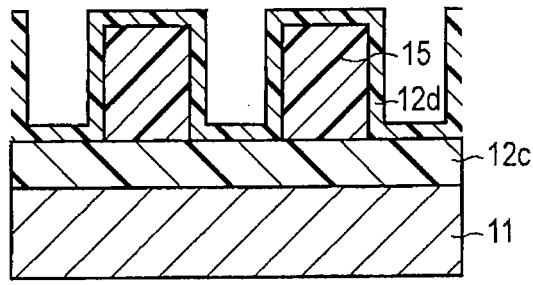
Figure 8B:
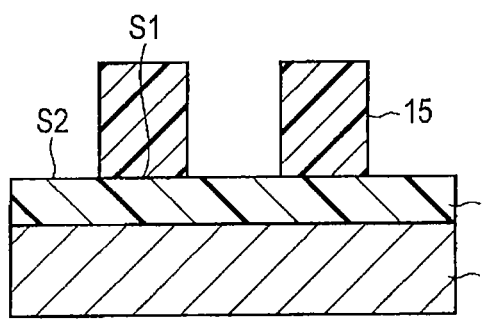

Subsequently, a photoresist was applied to the layer having the first surface energy 12c and the photoresist was baked and selectively irradiated with energy rays using an ArF immersion exposure tool. The exposure conditions were as follows: NA: 1.35, dipole illumination; center of opening: 0.85, σ: 0.1. A reticle has a line and space pattern and the line width is 42 nm and the space width was 42 nm. A patterned layer 15 with a half pitch of 42 nm and a line/space ratio of 1:1 was obtained by performing a post exposure bake and development with an aqueous 0.27N tetramethylammonium hydroxide solution (FIG. 8B).

The polarity of the patterned layer 15 was changed from hydrophobic to hydrophilic by irradiating the obtained patterned layer 15 with energy rays using the ArF exposure tool again and subjecting the patterned layer 15 to a post exposure bake (J. Y. Cheng et al.: ACS Nano 4 (2010) 4815) (FIG. 8C). A solution prepared by dissolving a polystyrene polymer brush precursor, which was obtained by converting the end of polystyrene to an OH-group, in toluene (i.e., a material of the layer having the second surface energy 12d) was applied to the resultant patterned layer 15. It was annealed in foaming gas ($N_2$:97%, $H_2$:3%) at 160° C. for 48 hours. The polystyrene polymer brush as the layer having the second surface energy 12d was bound to the surface of the layer having the first surface energy 12c (i.e. the first region S4) by a crosslinking reaction. Then, the unreacted polymer brush precursor was removed with toluene (FIG. 8D).

Figure 8E:
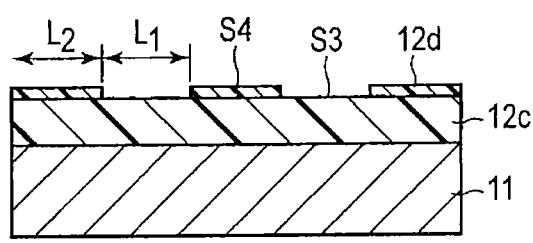
Figure 8C:
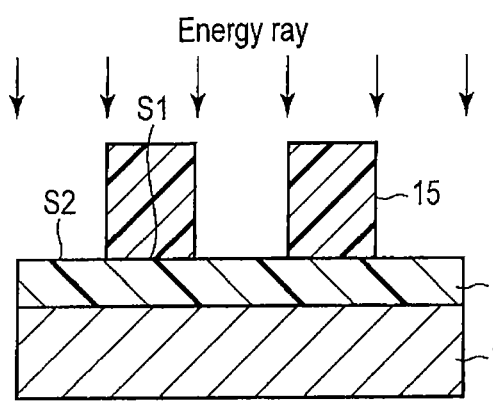

Thereafter, the patterned layer 15 was removed with tetramethylammonium hydroxide (FIG. 8E). When the patterned layer 15 was removed, the polystyrene polymer brush at the upper side or on the side surface of the patterned layer 15 was removed. As a result, a guide pattern in which a region having the first surface energy S3 and a region having the second surface energy S4 are alternately arranged in one direction.

The coating-type organic layer constituting the layer having the first surface energy 12c has almost the same energy as that of polymethylmethacrylate. The polystyrene polymer brush constituting the layer having the second surface energy 12d has almost the same surface energy as that of polystyrene.

The molecular weight of the used block copolymer is 88000 and the volume fraction of polystyrene is 50%. The pitch of the block copolymer pattern after the microphase separation is 28 nm. The line width of the region having the first surface energy S3 ($L_1$) and the line width of the region having the second surface energy S4 ($L_2$) were both 42 nm. In other words, the molecular weight of the block copolymer and the pitch of the guide pattern were set so that the pitch of the guide pattern (84 nm) was three times larger than the pitch of the block copolymer pattern (28 nm).

Figure 8F:
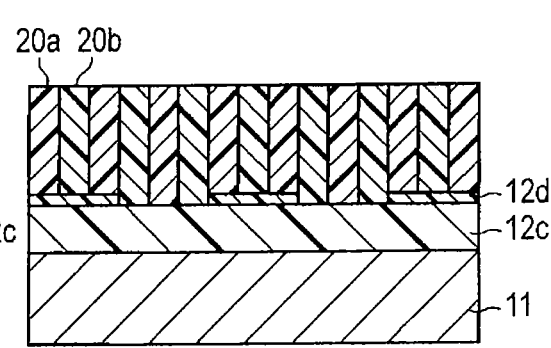

The block copolymer solution was applied to the produced guide pattern and the block copolymer film was annealed in foaming gas ($N_2$:97%, $H_2$:3%) at 180° C. for 48 hours. A microphase separation is caused in the block copolymer layer to form a microphase-separated structure shown in FIG. 8F. In FIG. 8F, it is found that a lamellar pattern in which a polystyrene block 20a and a polymethylmethacrylate block 20b are arranged alternately in the direction of the alternate arrangement of the region having the first surface energy and the region having the second surface energy and the interface of the polystyrene block and the polymethylmethacrylate block are perpendicular to the surface of the to-be-processed film are formed. The pitch of the block copolymer pattern after microphase separation was 28 nm.

Hereinafter, an example where the to-be-processed film 11 was etched using the lamellar pattern thus formed as an etching mask will be described using FIG. 9. Substrate 17 means the layer under the to-be-processed film 11 as shown in FIG. 9.

Only the polymethylmethacrylate block 20b was removed by $O_2$-plasma treatment from the block copolymer pattern. As a result, a line and space pattern comprised of the polystyrene block 20a was obtained (FIG. 9A). The pattern made of the polystyrene block 20a can be handled similarly to the resist pattern which is used in general lithography. Then, the layer having first and second surface energy 12c, 12d and the to-be-processed film 11 were etched using the polystyrene block 20a as a mask (FIG. 9B). The line and space pattern of the to-be-processed film 11 could be formed by removing the polystyrene block 20a and the layer having the first and second surface energy 12c, 12d as shown in FIG. 9C.

This example is superior to the conventional example. The reason is that it is not necessary to make the line width of the photoresist pattern for forming the guide pattern extremely narrower than the half pitch of the guide pattern. In the above example, the guide pattern is formed the method comprising forming the photoresist pattern by exposing with the ArF immersion exposure tool and patterning the polystyrene polymer brush using the patterned layer as a mold. When the resist pattern with a thinner line than the pitch of the guide pattern is formed and used as a mold, there is the probability that the line edge roughness increases and the pattern is cut during the process. However, in this example, the ratio of the line and space can be almost 1:1 in the photoresist pattern (The ratio may deviates from the ratio of 1:1 due to a pattern size change during the processing). As a result, the problems that are the line edge roughness increase and the cut of the pattern during the process can be avoided.

Further, because the exposure is performed by utilizing the two-beam interference with the ArF exposure tool which is effective to form 1:1 line and space pattern, the process margin of exposure is wide and a fine pattern can be formed. This is advantageous. Particularly, in the case of the 1:1 line and space pattern, if the two-beam interference like dipole illumination is used, the depth of focus is theoretically infinite.

However, if the ratio of the line and the space is shifted from the ratio of 1:1, an increase in size variability is significant when the focus is shifted and the depth of focus is extremely lowered. This has been described above with reference to FIG. 3. The simulation of FIG. 3 and this example were performed under the same conditions.

From FIG. 3, it is found that a wide range of depth of focus can be obtained in the case of the 1:1 line and space pattern as compared with the case of the 1:5 line and space pattern even if the exposure dose is changed. In an actual patterning, the margin is reduced by process factors. Thus, the margin in the actual patterning is narrowed as compared with that in the simulation. Accordingly, the 1:1 line and space pattern can be formed near the resolution limit of the exposure tool, but the 1:5 line and space pattern cannot be formed.

When the resist pattern is actually formed, a 1:1 line and space pattern with a width of 42 nm can be easily formed. However, the 1:5 line and space pattern having a line width of 14 nm and a space width of 70 nm cannot be formed. In other words, when the 1:1 line and space pattern instead of the 1:5 line and space pattern is formed as a chemical guide pattern, the chemical guide pattern having a smaller pitch can be formed. As a result, when the 1:1 line and space pattern is formed as a guide pattern, the pitch of the block copolymer pattern can be smaller. In the case where the same exposure tool is used, when the 1:1 line and space pattern is formed as the guide pattern, a finer block copolymer pattern can be formed as compared with the case where the 1:5 line and space pattern is formed as a guide pattern.

Here, the 1:1 line and space pattern was compared with the 1:5 line and space pattern. As the ratio of the width of the region having the first surface energy S3 ($L_1$) to the width of the region having the second surface energy S4 ($L_2$) is close to 1:1, the process margin of exposure when forming the guide pattern is widened. Therefore, it is preferable that the ratio of the width $L_1$ of the region having the first energy S3 ($L_1$) to the width of the region having the second surface energy S4 ($L_2$) is close to 1:1.

However, the width $L_1$ does not need to be completely matched to the width $L_2$. If the width $L_1$ and the width $L_2$ are nearly equal, a wide margin can be obtained as compared with the case where the ratio of the line and the space is 1:3 or 1:5. Further, if the width $L_1$ is three times larger than the half pitch of the block copolymer pattern and the width $L_2$ is five times larger than the half pitch of the block copolymer pattern, a wider margin can be obtained as compared with the case where the ratio of the line and the space is 1:3 or 1:5.

Comparative Example

The conventional example where the width of the pinning layer is nearly equal to the half pitch of the block copolymer pattern and the width of the neutralization layer is an odd multiple of the half pitch of the block copolymer pattern has been described above. Subsequently, as with the example, the conventional example where the width of the pinning layer is an odd multiple of the half pitch of the block copolymer pattern and the width of the neutralization layer is an odd multiple of the half pitch of the block copolymer pattern (a modified example of the conventional example, hereinafter called comparative example) will be described.

FIG. 10 is a view showing a method of forming a pattern according to a comparative example. A guide pattern was formed similarly to the example in this invention by replacing the layer having the first surface energy with the neutralization layer 12a and replacing the layer having the second surface energy with the pinning layer 12b (FIG. 10A).

Here, both the width of the pinning layer 12b and the width of the neutralization layer 12a are three times larger than the half pitch of the block copolymer pattern. That is, the width of the chemical guide pattern in the comparative example is the same as that of the example.

The difference between this comparative example and the example described above in this invention is that the surface energy of the pinning layer 12b and that of the neutralization layer 12a in the comparative example are different from the first and second surface energy the regions have in the example of this invention.

In the comparative example, the pinning layer 12b has a surface energy less than the lowest surface energy of the polymer constituting the block copolymer or a surface energy more than the highest surface energy of the polymer constituting the block copolymer. The neutralization layer 12a has an intermediate surface energy between that of the polymer blocks constituting the block copolymer. On the other hand, in the example of this invention, the region having the first surface energy has an surface energy almost the same as that of one of the polymer blocks constituting the block copolymer and the region having the second surface energy has an surface energy almost the same as that of the other polymer block constituting the block copolymer.

Figure 10A:
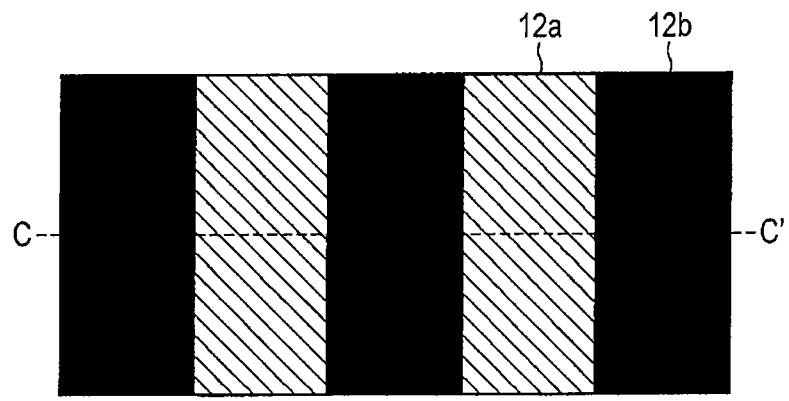
FIGS. 10A to 10D are views showing the method of forming a pattern according to a comparative example.
Figure 10B:
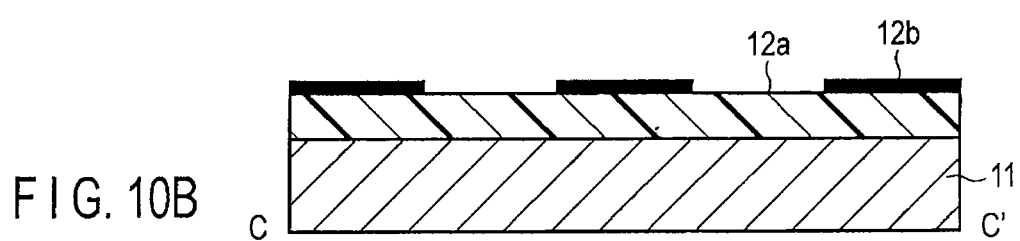

The block copolymer used herein is a block copolymer including a polystyrene block and a polymethacrylate block, similarly to the example of this invention. As the material of the pinning layer 12b, silicon, which has a surface energy higher than those of polystyrene and polymethylmethacrylate was used. As the material of the neutralization layer 12a, a polymer having a surface energy between those of polystyrene and polymethylmethacrylate was used. The precursor which was obtained by converting the end of a polystyrene-polymethylmethacrylate random copolymer to an OH group was applied to silicon and the polymer was reacted with a hydroxyl group on the surface of the silicon by cross-linking to form the neutralization layer 12a. FIG. 10A is a plan view of the guide pattern formed in the comparative example and FIG. 10B is a cross-sectional view cut at a line C-C'.

Figure 10C:
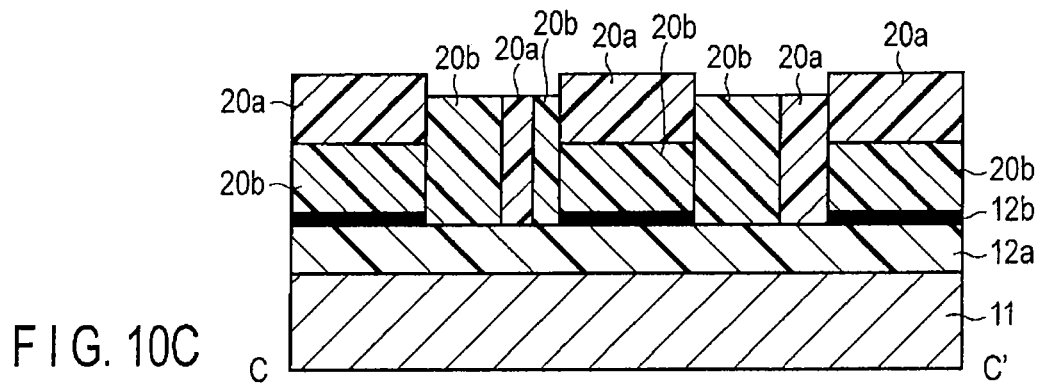
Figure 10D:
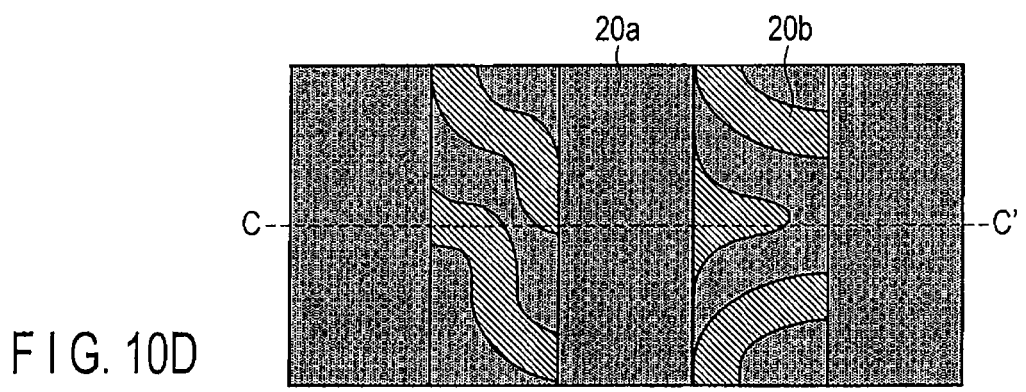

Similarly to the example of this invention, the block copolymer was applied on the guide pattern and the microphase separation was caused in the block copolymer layer by annealing. As a result, the microphase-separated structure was obtained as shown in FIG. 10C. FIG. 10D is a plan view showing the block copolymer pattern after microphase separation. FIG. 10C is a cross-sectional view cut at a line C-C'.

On the pinning layer 12b, the polymethylmethacrylate block and the polystyrene block stacked horizontally where the polymethylmethacrylate block 20b having an affinity with the pinning layer 12b is the lower layer and the polystyrene block 20a having no affinity with the pinning layer 12b is the upper layer of the block copolymer pattern. On the other hand, both of the polystyrene block and the polymethylmethacrylate block are attached on the neutralized layer 12a because the polystyrene block and the polymethylmethacrylate block have nearly equal affinity with the neutralization layer 12a. Although an interface between the polystyrene block 20a and the polymethylmethacrylate block 20b is perpendicular to the surface of the neutralized layer 12a, a fingerprint pattern like stripes is formed on the neutralization layer 12a as shown in FIG. 10D because the positions of polymer blocks are not controlled.

Thus, in the comparative example, a lamellar pattern in which two polymer blocks are arranged alternately in one direction and all of the interfaces of two blocks are perpendicular to the surface of the to-be-processed film 11 was not obtained.

On the other hand, in the example of this invention, polymethylmethacrylate has a high affinity with the region having the first surface energy S3 and polystyrene has a high affinity with the region having the second surface energy S4 respectively, which causes the pinning of the block copolymer at a boundary between the region having the first surface energy S3 and the region having the second surface energy S4. In addition, because the region having the first surface energy S3 has an affinity with polystyrene and the region having the second surface energy S4 has an affinity with polymethylmethacrylate not strongly but weakly, the lamellar block copolymer pattern in which polymethylmethacrylate block and polystyrene block are alternately arranged according to the guide pattern in one direction and the interface of the polystyrene block and the polymethylmethacrylate are vertical to the surface of the to-be-processed film 11 can be obtained as shown in FIG. 8F.

In the conventional pattern formation process, it has been contemplated that the optimum line width of the pinning layer is the half pitch of the block copolymer pattern. Therefore, it was necessary to make the line width of the pinning layer narrower as a target block copolymer pattern is finer. On the other hand, in this embodiment, it is not necessary to form such a fine pinning layer and it is possible to set the line width of the guide pattern in a wider range. Accordingly, the condition that the width ratio of the region having the first surface energy S3 ($L_1$) to the region having the second surface energy S4 ($L_2$) is close to 1:1 can be selected. The process margin of exposure becomes wider as the ratio approaches 1:1. Therefore, according to this embodiment, it is possible to form a guide pattern with high accuracy and cause microphase separation in the block copolymer layer more stably. As a result, when one of the polymer blocks constituting the block copolymer is removed and the remained pattern is used as an etching mask or the mold, the problems that the line edge roughness increases and the pattern is cut during the process can be prevented.

However, as is clear from the results of the comparative example, the block copolymer cannot be arranged regularly after microphase separation by simply widening the line width of the guide pattern in the conventional example. Using a guide pattern including a region having a surface energy almost the same as that of each polymer block constituting the block copolymer in place of the conventional guide pattern comprised of the pinning layer and the neutralization layer enables to obtain an intended microphase-separated pattern of a block copolymer according to the guide pattern with a wider line width.

The affinity between the guide pattern and block copolymer has been described above using the "surface energy" of the pinning layer, the neutralization layer, the region having the first surface energy and the region having the second surface energy which constitute the guide pattern and the first polymer block and the second polymer block which constitute the block copolymer.

The term "surface energy" used herein means the Gibbs free energy at the surface of a substance. The surface tension is the Gibbs free energy per unit area of the surface of a substance. As the surface energies of substances are closer to each other, the affinity of these substances is higher.

The solid surface energy can be calculated by calculating the solid surface tension.

There are several methods of measuring the solid surface tension and the examples are described below. The method to be described hereinafter is a method of calculating the surface tension of a target solid using measured contact angle of a liquid, of which the surface tension is known, with the target solid, of which the surface tension needs to be known. First, the measured contact angle is associated with the work of adhesion by using the Young-Dupre equation.

$$(1+\cos\theta)\gamma_L = W_{SL}$$

$\theta$: contact angle
$\gamma_L$: liquid surface tension
$W_{SL}$: work of adhesion decreased by attachment of the solid and liquid On the other hand, the surface tension component of the target solid can be calculated by modeling the work of adhesion and calculating the surface tension component because the surface tension component of the liquid is known in advance. The surface tension is determined by a plurality of surface tension components. When there are a plurality of unknown surface tension components of the target solid, a plurality of liquid, of which number is equal to the number of the unknown surface tension components, are used to measure contact angles of the liquids with the target solid. The surface tension components can be calculated by the measured contact angles. The surface tension of the target solid is obtained from the surface tension components thus obtained.

As the example, the following method is described in the article (R. D. Peters et al.: Langmuir 16, 4625 (2000)). According to the Fowkes-van Oss-Chaudhury-Good (FOCG) surface tension model, the solid surface tension is comprised of the Lifshitz-van der Waals component and a polar interaction component of lewis acid and base. This is represented by the following equations.

$$\gamma^{total} = \gamma^{LW} + \gamma^{AB}$$

$\gamma^{LW}$: Lifshitz-van der Waals component
$\gamma^{AB}$: polar interaction (or hydrogen bonding component)

$$\gamma^{AB} = 2(\gamma^+\gamma^-)^{1/2}$$

$\gamma^-$: electron-accepter component
$\gamma^+$: electron-donner component

The work of adhesion $W_{SL}$ can be represented by $2\{(\gamma_S^{LW}\gamma_L^{LW})^{1/2} + (\gamma_S^+\gamma_L^-)^{1/2} + (\gamma_S^-\gamma_L^+)^{1/2}\}$ and thus it is $(1+\cos\theta)\gamma_L = 2\{(\gamma_S^{LW}\gamma_L^{LW})^{1/2} + (\gamma_S^+\gamma_L^-)^{1/2} + (\gamma_S^-\gamma_L^+)^{1/2}\}$.

The surface tension components $\gamma_L$, $\gamma_L^{LW}$, $\gamma_L^+$, and $\gamma_L^-$ of the liquid are known in advance. Therefore, the surface tension components $\gamma_S^{LW}$, $\gamma_S^+$, and $\gamma_S^-$ of the target solid are variables. Thus, the surface tension component of the solid is calculated by measuring the contact angle of three types of liquids on the target solid. The solid surface tension is calculated from the obtained surface tension component of the solid.

In addition to the FOCG model, there is also a model which describes the work of adhesion using a dispersion force, an interaction force based on the polarity, and a hydrogen bond force. In this method, the work of adhesion $W_{SL}$ is represented by the following equation.

$$W_{SL} = 2\{(\gamma_S^d\gamma_L^d)^{1/2} + (\gamma_S^P\gamma_L^P)^{1/2} + (\gamma_S^H\gamma_L^H)^{1/2}\}$$

$\gamma^d$: dispersion force, $\gamma^P$: polarity force, $\gamma^H$: hydrogen bond force As with the FOCG surface tension model, the surface tension component of the liquid is known in advance. Thus, the surface tension component of the solid is calculated by measuring the contact angle of three types of liquid on the target solid.

In order to check the affinity of the liquid with the solid simply, a method of measuring a contact angle comprising dripping liquid onto the solid is used. The work of adhesion is calculated from the measured contact angle by the Young-Dupre equation shown above. The solid-liquid interfacial energy can be calculated by the following equation. The work of adhesion is also represented by the following equation.

$$\gamma_{SL} = \gamma_S + \gamma_L - W_{SL}$$

$\gamma_{SL}$: solid-liquid interfacial energy
$\gamma_S$: solid surface energy
$\gamma_L$: liquid surface energy From the equation, it is found that the work of adhesion is the energy reduced by attaching the liquid to the solid. As the work of adhesion is larger, the solid-liquid interfacial energy is reduced. A stable state means that an affinity of the liquid with the solid is high. The contact angle reflects the solid-liquid interfacial energy. Accordingly, if a contact angle of the same liquid with different solids is measured, the affinity between solids can be compared.

When surface tensions of the region having the first surface energy S1 and the region having the second surface energy S2 constituting the guide pattern and the first polymer block 14a and the second polymer block 14b constituting the block copolymer are calculated, the "surface energies" thereof can be calculated. Based on the calculated surface energies, a material having an affinity with the first polymer chain 14a is used as the material of the region having the first surface energy S1, and a material having an affinity with the second polymer block 14b is used as the material of the region having the second surface energy S2. The affinity can be indirectly determined by measuring the contact angle of the liquid with the solid. Based on the affinity, the materials of the region having the first surface energy S1 and the region having the second surface energy S2 in the chemical guide can be selected.

It is preferable for the surface energy of the region having the first surface energy S1 to be completely equal to that of the first polymer block 14a. However, if they are not completely equal, they may have an affinity with each other. Similarly, it is preferable for the surface energy of the region having the second surface energy S2 to be completely equal to that of the second polymer block 14b. However, if they are not completely equal, they may have an affinity with each other.

A difference in surface energy between the region having the first surface energy S1 and the first polymer block 14a and a difference in surface energy between the region having the second surface energy S2 and the second polymer block 14b are preferably within about 0.5 erg/cm². However, the value varies depending on various conditions such as the type of block copolymer to be used, the molecular weight, the composition, the annealing temperature, and the type of solvent at the time of coating.

In the examples, the exposure is performed using dipole illumination in order to generate two-beam interference; however, the exposure conditions are not limited thereto. When the dipole illumination is used, the illumination shape is not limited to circular. It may be a sector shape, an elliptical shape or the like. The important point is that the light diffracted from a reticule, which is necessary to resolve the guide pattern, passes through the pupil of the object lens of the exposure tool and reaches the surface of the wafer, and an image is formed by the interference effect. When the illumination is shaped with an aperture, the aperture having an opening is installed at a position where the diffracted light passes through a pupil of an object lens. When the illumination may be shaped by the beam reflection, the illumination light is emitted from the position where the diffracted light passes through the pupil of the object lens. When the size of the opening or the size of the beam is smaller, the background becomes lower and the resolution performance becomes higher. On the other hand, if the size of the opening or the beam is made smaller, the intensity of light is reduced. Thus, the size and shape of the opening is not uniquely determined. Consequently, the size and shape of the opening or beam may be appropriately selected according to the purpose. The illumination is not limited to the dipole illumination. It may be a quadrupole illumination or an annular illumination. This is because any shape is used as long as the illumination emits the incident light to a reticule and the diffracted light from a reticule, which is necessary to resolve the guide pattern, passes through the pupil of the object lens.

When ArF light is used for exposure, the exposure is performed using an ArF immersion exposure tool, an ArF dry exposure tool, an interference exposure tool using ArF light, an interference exposure tool using ArF light in liquid or the like. The light for exposure is not limited to ArF excimer laser light having a wavelength of 193 nm. KrF excimer laser light, X-rays, EUV light, and ultraviolet-light can be used. For example, an X-ray exposure tool, an EUV exposure tool, a KrF exposure tool, an electron beam writer, a laser beam writer, an ion beam writer, a particle beam writer, an X-ray two-beam interference exposure tool, an EUV two-beam interference-exposure tool, an ArF two-beam interference exposure tool, and a KrF two-beam interference exposure tool can be used.

In the optical lithography process, a pattern-transfer layer is formed between a resist pattern and substrate. The resist pattern is transferred to the pattern-transfer layer by etching and then the final substrate such as an oxide film or metal is etched by using the pattern of the pattern-transfer layer. Needless to say, in this embodiment, that pattern transfer process can be used.

The pattern-transfer layer is not limited to one layer and a plurality of the pattern-transfer layers may be used. The etching selectivity can be increased by combining the pattern-transfer layers. A hard mask such as silicon nitride (SiN) can be used as a transcription layer. A combination of a silicon oxide film and an organic film can also be used.

In the examples, the guide pattern was configured to include the coating layer and the polymer brush. However, the materials are not limited thereto because various layer can be used to adjust the surface energy. Usable examples of the layer include a Self-Assembled Monolayer (SAM) obtained by forming a monolayer of molecules on a substrate by reaction with the surface; a polymer brush formed by the reaction of a random copolymer, which contains the same component as that of the block copolymer and to which a group reacting with a substrate is added, with the substrate; a coating layer obtained by applying a polymer which formed by randomly binding one type of polymer adjusting the surface energy to another type of polymer having a crosslinking group, to a substrate and cross-linking by heating to form a cross-linked layer; a coating layer for adjusting the surface energy of which surface energy is changed by exposure; and a composite membrane formed by attaching a random copolymer which adjusts the surface energy, to a self-assembled monolayer. Further, a layer having a desired surface energy can be used as the layer having the first surface energy 12c and the layer having the second surface energy 12d. Examples of the layer include a metal layer such as gold, an oxide layer, a nitride layer, and an organic layer.

As the method of forming the layer having the first surface energy 12c on the to-be-processed film 11, chemical vapor deposition (CVD), spin coating, scanning coating or the like can be used.

It is possible to form the guide pattern by combining these methods.

It is preferable that the block copolymer has the composition in which the first polymer block and the second polymer block form a lamellar morphology after microphase separation. It is more preferable that one of the polymer block can be removed from the microphase-separated pattern. For example, a block copolymer comprised of polystyrene and polymethylmethacrylate is cited (hereinafter, a block copolymer comprised of a polymer A and a polymer B is designated as "polymer-A-b-polymer-B").

Other examples thereof include polystyrene-b-poly2-vinylpyridine, polystyrene-b-polyisoprene, polystyrene-b-polyethylene oxide, polystyrene-b-polydimethylsiloxane, polyisoprene-b-polyethylene oxide, polybutadiene-b-polyhexafluoropropylene oxide, polypentafluorostyrene-b-polymethylmethacrylate, polystyrene-b-poly{11-[4-(4-butylphenylazo)phenoxy]-undecyl-methacrylate}, polyethyleneoxide-b-poly{11-[4-(4-butylphenylazo)phenoxy]-undecyl-methacrylate}, polystyrene-b-polyhedral oligomeric silsesquioxane methacrylate, and polymethylmethacrylate-b-polyhedral oligomeric silsesquioxane methacrylate. In addition to the above examples, any combination of polymers having the $\chi$ parameter sufficient for microphase separation may be used. The block copolymer to be used can be selected according to the etching resistance, size, and purpose.

Although the case where the block copolymer comprised of two blocks is used, has been mainly described herein, the block copolymer comprised of three or more blocks can be similarly used. When a triblock copolymer comprised of three types of polymer blocks, A, B, and C is used, a lamellar phase in which the blocks are repeatedly arranged in the order of A, B, C, B, and A is formed. In this case, guide pattern including three regions having the surface energies nearly equal to those of the three blocks A, B, and C.

Examples of the triblock copolymer include polystyrene-b-polybutadiene-b-polymethylmethacrylate and polystyrene-b-(polyethylene-co-polybutylene)-b-polymethylmethacrylate. When the triblock copolymer is used, the triblock copolymer can be selected according to the purpose, similarly to the case of the diblock copolymer.

Further, the same type of block copolymers having a different molecular weight may be mixed. The same kind of polymer constituting a block copolymer may be added to the block copolymer as a homopolymer. The pitch of block copolymer and the microphase separation temperature can be controlled in the above manner.

Further, a polymer different from any polymer constituting the block copolymer may be added to the block copolymer as a homopolymer. For example, polystyrene-b-polyethylene oxide to which organo-silicate can be added. An additional effect such as improvement in etching resistance is obtained by using the above block copolymer.

For microphase separation of block copolymers, block copolymers are generally annealed at a temperature equal to the glass transition temperature or higher. However, if the temperature of annealing rises beyond the order-disorder transition temperature (ODT), a disordered structure is built so that no microphase-separated structure can be obtained. Thus, it is preferable to anneal at a temperature of the glass transition temperature or more and the ODT or less. An annealing device is not limited. Preferably, an oven, a hot plate or the like is used.

The atmosphere during annealing is not limited. It is preferable to perform annealing under an atmosphere of an inert gas such as argon or nitrogen from the viewpoint of preventing decomposition of block copolymers. Annealing may also be performed under an atmosphere of a gas which can cause a reduction such as hydrogen mixed with an inert gas, if necessary. Alternatively, the block copolymer may be microphase-separated by placing it under an organic solvent atmosphere to transfer the block copolymer in place of heating.

If, after microphase separation of block copolymers as described above, one of the first and second polymer block is selectively removed from the block copolymer pattern 13 and a line and space pattern of block copolymers can be formed. The remained polymer block can be used as a mask pattern to etch an to-be-processed film 11.

In the example, the polymethylmethacrylate block 20b was removed by the $O_2$-plasma treatment. However, the method of removing one of the polymer block after the microphase separation is not limited thereto and any conventionally known method can be employed. For example, a reactive ion etching method can be used. As the method of removing one of the polymer blocks after the microphase separation, reactive ion etching (RIE) is preferred. According to this method, one of the polymer blocks can be removed because the first and second polymer blocks have different reactive ion etching resistance. For example, when the block copolymer is polystyrene and polybutadiene, only a polystyrene block can be left by an ozone process. When the block copolymer is polystyrene and polymethylmethacrylate, only the polystyrene block can be left by reactive ion etching using reactive gases such as $O_2$ and $CF_4$.

When the dry development is carried out, a etching gas is selected in the view point of high selectivity between polymer blocks constituting the block copolymer. A halogen-type gas including fluorine, chlorine, bromine or iodine and halocarbon can be used. The selectivity of the polymer blocks and the pattern shape may be controlled by adding a small amount of gas to the halogen-type gas. Not only the dry development but also the wet development may be carried out. When polystyrene-b-polymethylmethacrylate is used as the block copolymer, for example, polymethylmethacrylate is irradiated with UV light to cut the polymer block chain and the resultant products may be developed with acetic acid. One of the polymer block may be evaporated by heating. Or, polystyrene-b-polymethylmethacrylate is irradiated with UV light in a vacuum to remove polymethylmethacrylate. When polystyrene-b-polydimethylsiloxane is used, polystyrene can also be removed by heating at 400° C. in a vacuum. Thus, as for the methods of removing the polymer block, various methods can be selected depending on the block copolymer to be used.

In the examples, as the process of forming a guide pattern, a layer having the first surface energy (namely, a coating layer) is first formed, a patterned layer of photoresist is formed thereon, and a layer having the second surface energy (namely, a polystyrene polymer brush) is formed. Thereafter, the layer having the second surface energy on the surface of the photoresist pattern is removed with the photoresist. Then, a chemical guide pattern is formed. Thus, the guide pattern is formed by a so-called lift-off process using the photoresist.

However, the process of forming a guide pattern using a photoresist is not limited thereto. As another process, the following processes are contemplated. Unless otherwise noted, the materials used in the modified examples below are similar to those in the examples.

Modified Example 1

FIG. 11 is a cross-sectional view showing a method of forming a pattern according to Modified example 1.

The layer having the first surface energy 12c and the layer having the second surface energy 12d were stacked on the to-be-processed film 11 (FIG. 11A). The photoresist pattern 15 was formed thereon, similarly to the example (FIG. 11B). A guide pattern was formed by etching the layer having the second surface energy 12d using the photoresist pattern 15 as a mask (FIG. 11C).

The same microphase-separated structure as the example was obtained by applying a block copolymer on the guide pattern and causing microphase separation, similarly to the example.

Modified Example 2

FIG. 12 is a cross-sectional view showing a method of forming a pattern according to Modified example 2.

The layer having the first surface energy 12c was formed on the to-be-processed film 11 (FIG. 12A). The photoresist pattern 15 was formed on the layer having the first surface energy 12c, similarly to the example (FIG. 12B). The layer having the first surface energy 12c was etched using the photoresist pattern 15 as a mask (FIG. 12C). After the etching, the layer having the second energy 12d was selectively formed on a portion from which the layer having the first surface energy 12c was removed to form a guide pattern (FIG. 12D).

The same microphase-separated structure as the example was obtained by applying a block copolymer on the guide pattern and causing microphase separation, similarly to the example.

Modified Example 3

FIG. 13 is a cross-sectional view showing a method of forming a pattern according to Modified example 3.

The process from the start to the step of etching the layer having the first surface energy 12c using the photoresist pattern 15 as a mask was performed similarly to Modified example 2. Thereafter, as shown in FIG. 13A, the layer having the second surface energy 12d was formed on the to-be-processed film 11 and the layer having the first surface energy 12c. The formed layer having the second surface energy 12d was subjected to etchback until the layer having the first surface energy 12c was exposed and a guide pattern was formed (FIG. 13B).

The same microphase-separated structure as the example was obtained by applying a block copolymer on the guide pattern and causing microphase separation, similarly to the example.

Modified Example 4

FIG. 14 is a cross-sectional view showing a method of forming a pattern according to Modified example 4.

The layer having the first surface energy 12c was formed on the to-be-processed film 11 (FIG. 14A). The photoresist pattern 15 was formed on the layer having the first surface energy 12c, similarly to the example. The photoresist pattern 15 was directly used as the layer having the second surface energy to form a guide pattern (FIG. 14B).

The same microphase-separated structure as the example was obtained by applying a block copolymer on the guide pattern and causing microphase separation, similarly to the example.

Modified Example 5

FIG. 15 is a cross-sectional view showing a method of forming a pattern according to Modified example 5.

Figure 15A:
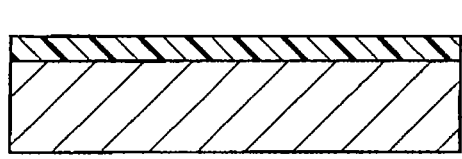
FIGS. 15A to 15D are cross-sectional views showing a method of forming a pattern according to Modified example 5.
Figure 15C:
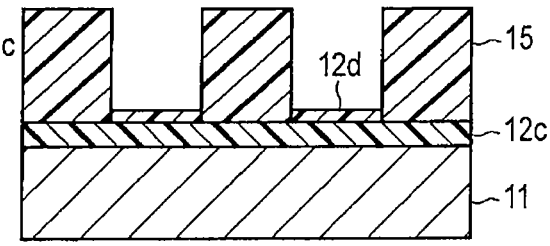
Figure 15B:
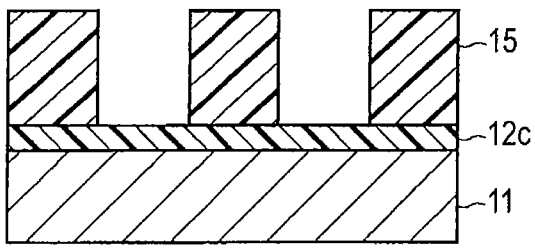
Figure 15D:
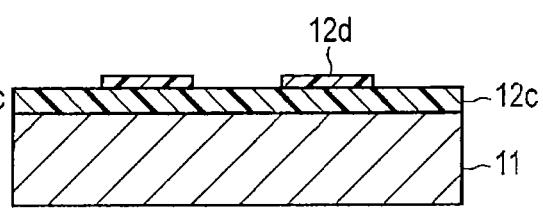

The layer having the first surface energy 12c was formed on the to-be-processed film 11 (FIG. 15A) and the photoresist pattern 15 was formed on the layer having the first surface energy 12c, similarly to the example (FIG. 15B). The layer having the second surface energy 12d was selectively formed on regions of the layer having the first surface energy 12c where photoresist pattern 15 is not formed (FIG. 15C). The guide pattern shown in FIG. 15D was obtained by removing the photoresist pattern 15.

In this method, a guide pattern may be formed by forming the thick layer having the second surface energy 12d on the photoresist pattern 15 and the layer having the first surface energy. Then, the top parts of the layer having the second surface energy 12d and the photoresist pattern are removed to be thin by etchback.

The same microphase-separated structure as the example was obtained by applying a block copolymer on the guide pattern and causing microphase separation, similarly to the example.

Modified Example 6

Figure 16A:
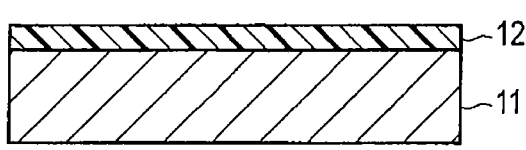
FIGS. 16A and 16B are cross-sectional views showing a method of forming a pattern according to Modified example 6.
Figure 16B:
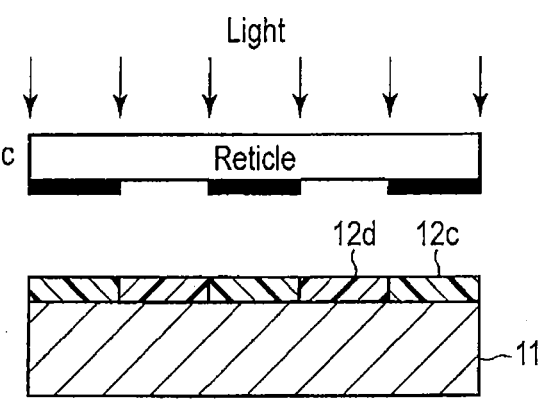

FIG. 16 is a cross-sectional view showing a method of forming a pattern according to Modified example 6.

Here, the layer having the first surface energy 12c includes a photosensitive material. As an example, a silane coupling agent was supplied to the silicon substrate.

The layer having the first surface energy 12c was selectively irradiated with ArF light via reticle. The exposed region was used as the layer having the second surface energy 12d to form a guide pattern.

In this case, an excellent process margin of exposure in the guide pattern formation can be obtained by setting the ratio of the line width and the space width to 1:1 in the guide pattern, similarly to the case where the photoresist pattern is formed.

The same microphase-separated structure as the example was obtained by applying a block copolymer on the guide pattern and causing microphase separation, similarly to the example.

According to the embodiment or the examples, it is possible to form a guide pattern having a wide process margin with high accuracy, in the method of forming a pattern using the microphase separation of the block copolymer. According to the embodiment or the examples, it is possible to obtain a microphase-separated structure of a block copolymer which is finer than the guide pattern.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming a pattern, comprising:
    forming a guide pattern including a first region having a first surface energy and a second region having a second surface energy which is different from the first surface energy on a to-be-processed film, the first and second regions alternately arranged in one direction
    forming a block copolymer layer on the guide pattern, the block copolymer comprising of a first polymer block and a second polymer block; and causing microphase separation in the block copolymer layer to arrange the first and the second polymer block according to the guide pattern, the microphase-separated structure is a lamellar block copolymer pattern in which the first polymer block and the second polymer block are arranged alternately in the direction of the alternative arrangement of the first and second regions and the interface of the first polymer block and the second polymer block are perpendicular to the surface of the to-be-processed film;

where the first surface energy is almost the same as a surface energy of the first polymer block, the second surface energy is almost the same as a surface energy of the second polymer block, a pitch of the guide pattern is n times a pitch of the block copolymer pattern, wherein n means an integral number of three or more, and each width of the first and second regions in the direction of arrangement of the first and second regions is m times of a half pitch of the block copolymer pattern, wherein m means odd number of three or more.

2. The method according to claim 1, wherein the width of the first region is almost the same as that of the second region.

3. The method according to claim 1, wherein the guide pattern is formed using a method comprising:

applying a photoresist on the to-be-processed film to form a photoresist layer;

irradiating a portion of the photoresist layer with energy rays selectively;

developing the photoresist layer to form a photoresist pattern;

using the photoresist pattern as an etching mask or as a mold to form the first region and the second region.

4. The method according to claim 3, wherein the energy ray is selected from the group consisting of KrF excimer laser light, ArF excimer laser light, X-rays, EUV light, and ultraviolet light.

5. The method according to claim 3, wherein the irradiation with energy rays is performed by two-beam interference.

6. The method according to claim 1, wherein a photosensitive material is formed on a to-be-processed film, and the guide pattern is formed by irradiating the part of the photosensitive material, which becomes either of the first and second regions, with energy rays or irradiating the first and second regions with energy rays under different conditions to cause a difference in surface free energy between the first and second regions.

7. The method according to claim 6, wherein the energy ray is selected from the group consisting of KrF excimer laser light, ArF excimer laser light, X-rays, EUV light, and ultraviolet light.

8. The method according to claim 6, wherein the irradiation with energy rays is performed by two-beam interference.

9. The method according to claim 1, further comprising:

removing either of the first and second polymer blocks selectively from the block copolymer pattern; and etching the surface of the to-be-processed film using the remained block copolymer pattern as an etching mask.

* * * * *